(12) United States Patent
Lubinsky et al.

(10) Patent No.: US 11,802,979 B2
(45) Date of Patent: Oct. 31, 2023

(54) FLAT PANEL X-RAY IMAGER WITH SCINTILLATING GLASS SUBSTRATE

(71) Applicant: THE RESEARCH FOUNDATION FOR THE STATE UNIVERSITY OF NEW YORK, Albany, NY (US)

(72) Inventors: Anthony Lubinsky, Port Jefferson Station, NY (US); Adrian Howansky, Centereach, NY (US); Wei Zhao, East Setauket, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 0 days.

(21) Appl. No.: 16/755,261

(22) PCT Filed: May 23, 2019

(86) PCT No.: PCT/US2019/033683
§ 371 (c)(1),
(2) Date: Apr. 10, 2020

(87) PCT Pub. No.: WO2019/226859
PCT Pub. Date: Nov. 28, 2019

(65) Prior Publication Data
US 2021/0063586 A1 Mar. 4, 2021

Related U.S. Application Data

(60) Provisional application No. 62/788,162, filed on Jan. 4, 2019, provisional application No. 62/675,343, filed on May 23, 2018.

(51) Int. Cl.
*G01T 1/20* (2006.01)
*H01L 27/146* (2006.01)

(52) U.S. Cl.
CPC .......... *G01T 1/2008* (2013.01); *G01T 1/2006* (2013.01); *G01T 1/2012* (2013.01); *G01T 1/2018* (2013.01); *H01L 27/14658* (2013.01)

(58) Field of Classification Search
CPC ... G01T 1/2008; G01T 1/2006; G01T 1/2012; G01T 1/2018; G01T 1/20; G01T 1/2002; G01T 1/202; H01L 27/14658
See application file for complete search history.

(56) References Cited

U.S. PATENT DOCUMENTS 5,017,782 A    5/1991 Nelson
5,198,673 A    3/1993 Rougeot et al.
(Continued)

FOREIGN PATENT DOCUMENTS

JP    2017015627 A  *  1/2017

OTHER PUBLICATIONS

Beckert et al., Medical imaging scintillators from glass-ceramics using mixed rare-earth halides, Sep. 14, 2016, Optical Materials, vol. 60, pp. 513-520. (Year: 2016).*

(Continued)

*Primary Examiner* — Christine S. Kim
(74) *Attorney, Agent, or Firm* — Scully, Scott, Murphy & Presser, P.C (57) ABSTRACT

Structures operable to detect radiation are described. An imaging system is also described having the structures. For example, a structure may include two screens and a photosensor array between the two screens. One of the screens is comprised of a scintillating glass substrate. The scintillating glass substrate may serve two purposes. The scintillating glass substrate converts incident x-rays into light photons. Additionally, the scintillating glass substrate is a substrate (Continued)

for the photosensor array. The photosensor array is configured to detect light photons that reach the photosensor array from both screens.

15 Claims, 7 Drawing Sheets

(56) References Cited

U.S. PATENT DOCUMENTS

| | | | |
|---|---|---|---|
| 5,430,298 A | 7/1995 | Possin et al. | |
| 5,596,198 A | 1/1997 | Perez-Mendez | |
| 5,864,146 A | 1/1999 | Karellas | |
| 6,031,234 A | 2/2000 | Albagli et al. | |
| 6,172,371 B1 | 1/2001 | DeJule et al. | |
| 6,541,774 B1 | 4/2003 | DeJule et al. | |
| 6,717,174 B2 | 4/2004 | Karellas | |
| 7,019,304 B2 | 3/2006 | Albagli et al. | |
| 7,078,702 B2 | 7/2006 | Ringermacher et al. | |
| 7,105,826 B2 | 9/2006 | Ren et al. | |
| 7,122,804 B2 | 10/2006 | Mollov | |
| 7,180,075 B2* | 2/2007 | Brabec | G01T 1/2018 250/370.11 |
| 7,569,832 B2 | 8/2009 | Tredwell et al. | |
| 7,745,798 B2* | 6/2010 | Takahashi | H01L 27/14676 250/370.11 |
| 7,956,332 B2 | 6/2011 | Burr et al. | |
| 8,106,363 B2 | 1/2012 | Yip | |
| 8,294,112 B2 | 10/2012 | Levene et al. | |
| 8,338,790 B2 | 12/2012 | Levene et al. | |
| 8,399,841 B2 | 3/2013 | Hansen et al. | |
| 8,558,185 B2 | 10/2013 | Tredwell | |
| 8,569,704 B2 | 10/2013 | Tredwell | |
| 8,629,402 B2 | 1/2014 | Aylward et al. | |
| 8,648,310 B2 | 2/2014 | Mollov | |
| 8,729,478 B2 | 5/2014 | Tredwell et al. | |
| 8,772,728 B2 | 7/2014 | Tredwell | |
| 8,853,652 B2 | 10/2014 | Jagannathan et al. | |
| 9,012,857 B2 | 4/2015 | Levene et al. | |
| 9,064,678 B2 | 6/2015 | Ferenc | |
| 9,075,150 B2* | 7/2015 | Tredwell | G01T 1/20183 |
| 9,348,034 B2 | 5/2016 | Tredwell et al. | |
| 9,395,451 B2 | 7/2016 | Menge | |
| 9,864,070 B2 | 1/2018 | Suponnikov et al. | |
| 10,302,775 B2* | 5/2019 | Kobayashi | G01T 1/2002 |
| 10,371,830 B2 | 8/2019 | Jacobs et al. | |
| 10,444,378 B1* | 10/2019 | Morf | G01T 1/242 |
| 10,527,739 B2 | 1/2020 | Chappo et al. | |
| 11,041,966 B2 | 6/2021 | Chappo | |
| 11,181,488 B2 | 11/2021 | Booker et al. | |
| 11,460,590 B2 | 10/2022 | Ubinsky et al. | |
| 2002/0070365 A1 | 6/2002 | Karellas | |
| 2006/0151708 A1* | 7/2006 | Bani-Hashemi | G01T 1/2018 250/370.11 |
| 2008/0210877 A1 | 9/2008 | Altman et al. | |
| 2008/0245968 A1 | 10/2008 | Tredwell et al. | |
| 2011/0303849 A1 | 12/2011 | Tredwell et al. | |
| 2013/0256538 A1 | 10/2013 | Vogtmeier | |
| 2015/0123119 A1 | 5/2015 | Sekine et al. | |
| 2016/0322411 A1 | 11/2016 | Elen et al. | |
| 2018/0239034 A1* | 8/2018 | Tian | G01T 1/2018 |
| 2019/0056515 A1* | 2/2019 | Kobayashi | G01T 1/2008 |
| 2020/0174141 A1* | 6/2020 | Lubinsky | G01T 1/20183 |

OTHER PUBLICATIONS

Canadian Examination Report dated Aug. 19, 2020 received in Canadian Application No. 3,080,643.
International Search Report dated Aug. 15, 2019 issued in PCT/US2019/033683.
Written Opinion dated Aug. 15, 2019 issued in PCT/US2019/033683.

\* cited by examiner

FLAT PANEL X-RAY IMAGER WITH SCINTILLATING GLASS SUBSTRATE

CROSS REFERENCE TO RELATED APPLICATIONS

This application claims the benefit of U.S. Provisional Application No. 62/675,343 filed on May 23, 2018, and U.S. Provisional Application No. 62/788,162 filed on Jan. 4, 2019.

FIELD

The present application relates generally to structures for radiation detectors, radiation detection and digital radiography.

BACKGROUND

Flat Panel Detectors (FPD) have been used for digital x-ray imaging devices. For example, "Indirect" FPDs form x-ray images by detecting the incoming spatial distribution of x-rays with a scintillating screen, e.g., x-ray conversion layer combined with a 2D photosensor array. Known FPD may use a single screen in either a front illuminated (FI) Mode in which the incoming x-rays pass first through the scintillating screen or in a back illuminated BI mode, in which the x-rays pass first through the photosensor array. However, a large fraction of the incident x-ray beam passes through the screen undetected. Increasing the thickness of the single scintillating layer is not a viable solution because the image quality would then suffer from excessive spatial blur.

While the use of two screens, e.g., a front screen and back screen, sandwiched around an array have been described in documents, the inventors are not aware of any commercial structures, and particular structures for x-ray imaging having this configuration.

SUMMARY

Accordingly, disclosed are structures, imaging systems and detectors, that provide improved image quality and dose performance. For example, a structure may comprise two screens. A photosensor array is between the two screens. One of the screens is comprised of a scintillating glass. The scintillating glass serves a dual purpose, serving as a substrate for the deposition of a photosensor array, and also acting as an x-ray detection structure.

In an aspect of the disclosure, the screen comprised of a scintillating glass may be the "back screen" e.g., the screen further from an x-ray source. Further, the front screen may be comprised of a scintillating layer, e.g., phosphors. In an aspect of the disclosure, the phosphors may be a powdered, granular type or a columnar type or nanocrystalline powder type or perovskite scintillator type. In other aspects of the disclosure, the front screen may be comprised of a scintillating glass.

The front screen converts an absorbed portion of incident radiation directed at the structure into light photons and back screen converts an absorbed portion of the incident radiation transmitted through the front screen and the photosensor array into light photons.

The photosensor array is operable to capture the light photons from the front screen and the back screen and convert the captured light photons into electrical signals.

Also disclosed is a structure that comprises a first scintillating screen, a photosensor array and a second scintillating screen. The first scintillating screen converts an absorbed portion of incident radiation directed at the structure into light photons. The photosensor array is between the first scintillating screen and the second scintillating screen. The second scintillating screen is comprised of a scintillating glass. The scintillating glass converts an absorbed portion of the incident radiation transmitted through the first scintillating screen and the photosensor array into light photons. A surface of the first scintillating screen faces the photosensor array and a surface of the scintillating glass faces the photosensor array. The photosensor array is operable to capture at least a portion the light photons from the first scintillating screen and the second scintillating screen and convert the captured light photons into electrical signals.

In an aspect of the disclosure, the photosensor array may comprise a plurality of photosensitive storage elements for capturing the light photons from the first scintillating screen and the second scintillating screen, a plurality of switching elements, a transparent metal bias layer, and a 2D patterned transparent metal layer. One switching element of the plurality of switching elements corresponds to one of the plurality of photosensitive storage elements, respectively.

In an aspect of the disclosure, the scintillating glass and the photosensor array are in direct optical contact with each other.

In an aspect of the disclosure, the surface of the scintillating glass is a substrate for the photosensor array.

In an aspect of the disclosure, one or both of the scintillating screens may have a backing. The color of the backing may be determined based on an application of the structure. For example, the backing may be absorptive or reflective to the light photons emitted.

In an aspect of the disclosure, the 2D patterned transparent metal layer and the transparent metal bias layer may be comprised of indium tin oxide (ITO).

In an aspect of the disclosure, portions of the transparent metal bias layer may not be transparent to the light photons. The portions are aligned with the plurality of switching elements as viewed from the transparent metal bias layer to the 2D patterned transparent metal layer.

In an aspect of the disclosure, a thickness of the second scintillating screen is greater than a thickness of the first scintillating screen.

Also disclosed is an imaging system. The imaging system comprises a processor in communication with one of the structures described herein. The processor is configured to: receive the electrical signals from the structure; and produce an image having a plurality of pixels using the electrical signals. Each switching element and the corresponding photosensitive storage element produce a pixel in the image.

In an aspect of the disclosure, a processor controls each row of switching elements sequentially, thereby connecting the corresponding photosensitive storage elements to a row of amplifiers (for readout), whose outputs are digitized to the pixel values for each row of the image.

Also disclosed is a radiation detector which comprises a first radiation converter, a second radiation converter and a photosensor array between the first radiation converter and the second radiation converter. The second radiation converter is comprised of scintillating glass. The first radiation converter is configured to receive and partially absorb incident penetrating radiation directed towards the radiation detector; and convert the absorbed incident radiation into a burst of a plurality of light photons, a number of which reach the photosensor array and are detected. The second radiation converter is configured to: receive and partially absorb the portion of the incident radiation transmitted through the first radiation converter and the photosensor array; and convert the absorbed radiation into a burst of a plurality of light photons, a number of which reach the photosensor array and are detected. The photosensor array is configured to respond a spatial pattern of the light photons from the first radiation converter and the second radiation converter by converting the light photons into an electrical signal pattern representative of a sum of the spatial pattern of the light photons from the first radiation converter and the spatial pattern of the light photons from the second radiation converter.

DETAILED DESCRIPTION

Figure 7:
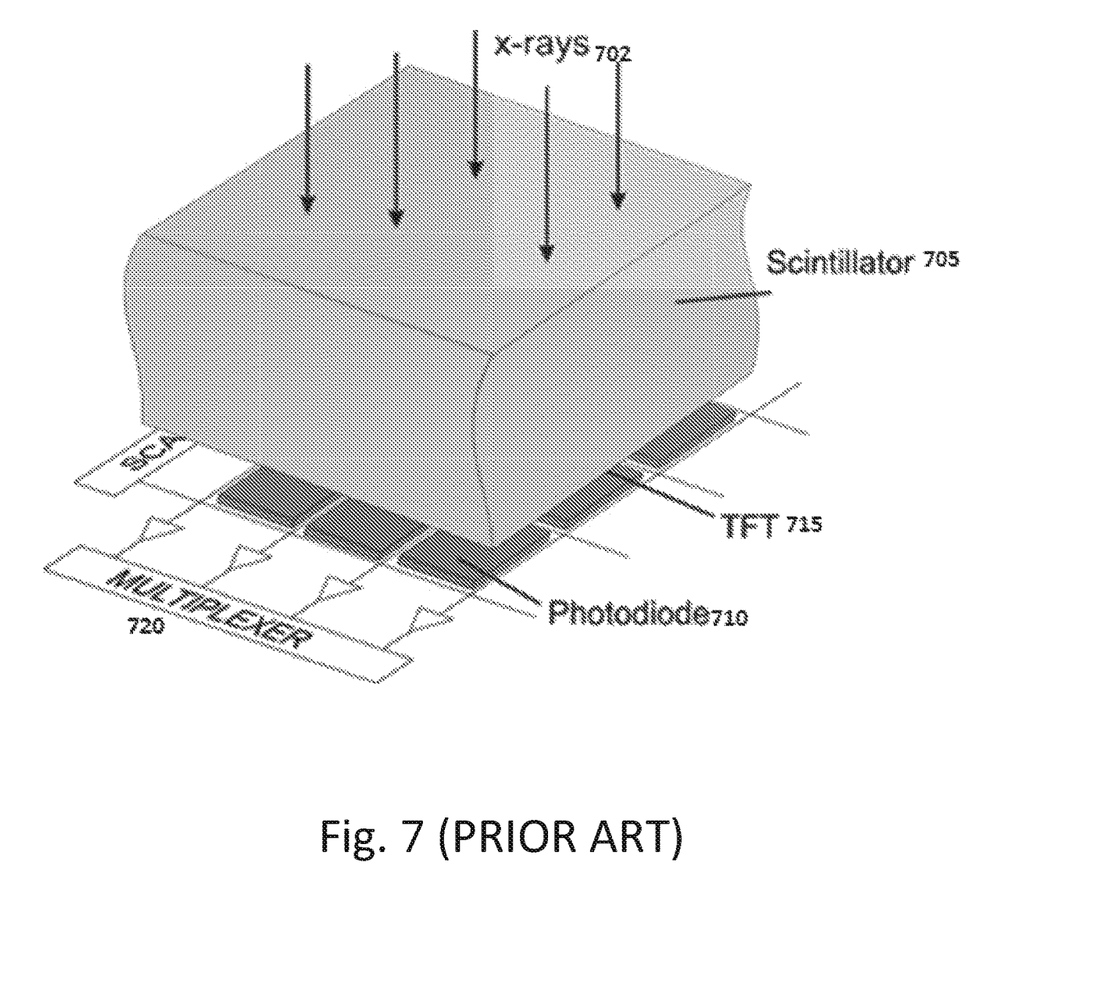
FIG. 7 shows an example of an indirect single screen structure.

An illustration of a portion of a single-screen FPD 700 is shown in FIG. 7. As shown, x-rays 702 are directed toward the screen 705 from a source. A photosensor array which includes a photodiode 710 and TFT 715 are on the opposite side of the source (not shown). The photodiode 710 converts the light it detects into electrical signals which are sent to the multiplexer 720. A scanning control unit is partially shown in FIG. 7. The thickness of the single x-ray screen (scintillator 705) to be used for a particular imaging application is typically chosen based on a tradeoff between x-ray absorption and spatial resolution. Increasing thickness improves x-ray absorption and thus sensitivity (reducing dose), but also decreases resolution because of light scattering in the phosphor layer, necessitating a compromise.

The inventors have improved the absorption for a structure without losing spatial resolution by using two screens for the structure and having one of the screens as both a light detector and a substrate for the photosensor array. The disclosed two screen configurations enable a reduction in dose as well, without losing resolution. This is because the two screens sandwich the photosensor array and the average distance from an absorption event to the array is lessened, thus minimizing the effect of light scatter. The collective thickness of the two screens may be made thicker than the single screen (and thus increasing x-ray absorption) but at the same time having equal or better resolution.

Additionally, the inventors have used a scintillating glass for both the substrate for depositing the photosensor array on as well as for one of the screens. Thus, eliminating a need for a separate and distinct glass substrate to depose the photosensor array on. By using the scintillating glass as the substrate and the screen, the inventors have removed a source of a loss of sharpness due to light spreading within the substrate between the screen and the photosensor array and other deleterious light piping effects. In addition, more light photons from the scintillating glass will reach the photosensor array, due to the elimination of any absorption in a separate substrate layer.

Figure 1:
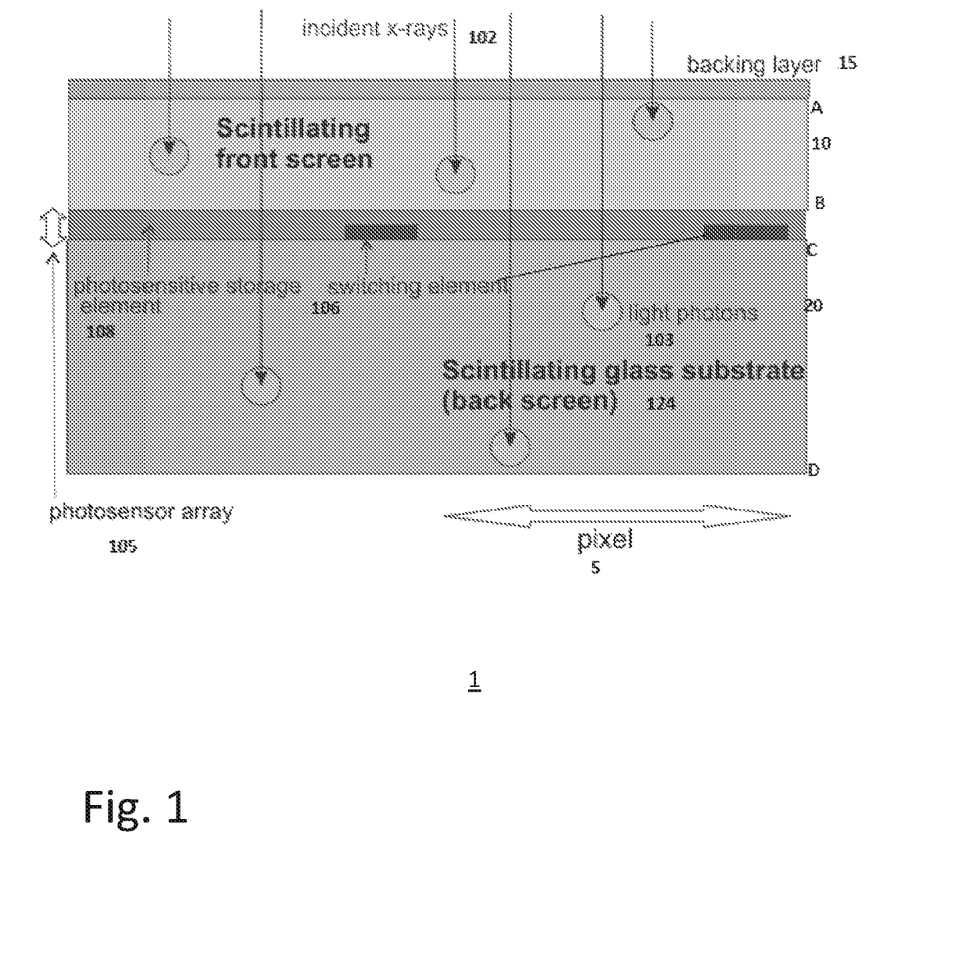
FIG. 1 is a schematic cross-sectional view of a structure in accordance with aspects of the disclosure.
Figure 2:
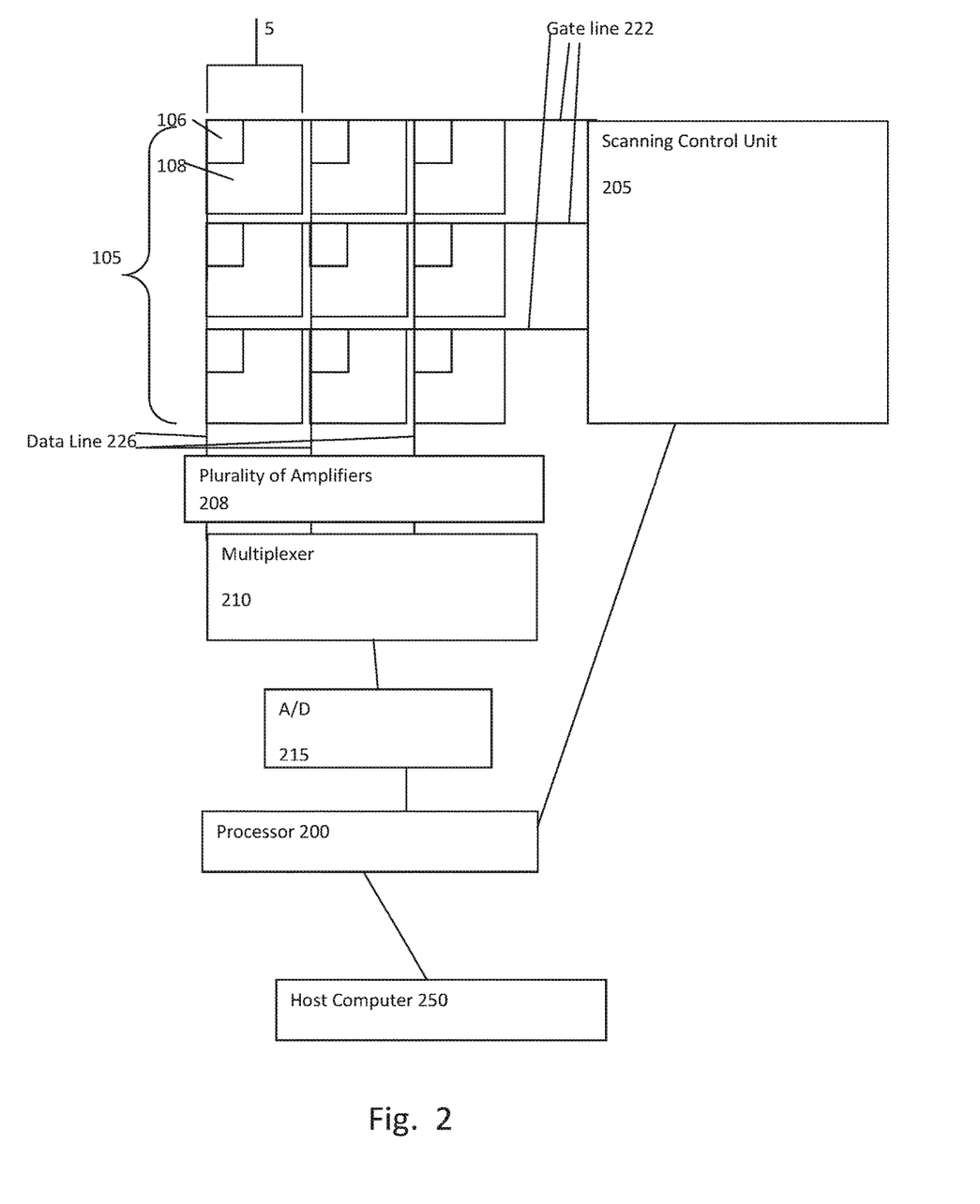
FIG. 2 is a schematic view showing an photosensor array and certain control components in accordance with aspects of the disclosure.

FIG. 1 illustrates a structure 1 in accordance with aspects of the disclosure. The structure 1 may be used in an imaging system. Parts of an imaging system are shown in FIG. 2. The structure 1 may include two screens 10, 20 (front screen 10, back screen 20). The front screen 10 is the screen that is closest to the radiation source (not shown) of the two screens. The structure 1 further includes a photosensor array 105. The photosensor array 105 may be disposed between the front screen 10 and the back screen 20. The front screen 10 has a surface B facing the photosensor array 105. The back screen 20 has a surface C facing the photosensor array 105.

As shown in FIG. 1, the back screen 20 is comprised of a scintillating glass substrate 124. This disclosure uses the phrase "scintillating glass substrate" because the "glass" is scintillating and is a substrate for the photosensor array 105.

The scintillating glass substrate 124 may include x-ray scintillating materials that may capture the incident x-rays 102 and convert the captured x-rays into light photons 103. In some examples, the scintillating glass substrate 124 may be a borosilicate or alumino-borosilicate host glass containing a substantial molar fraction of rare-earth halides like BaF2, GdF3, GdBr3 or TbF3, or other types known in the art. As described herein, the scintillating glass substrate 124 may be a glass ceramic material. The glass ceramic material may consist of luminescent nanocrystals embedded within a glass matrix.

For example, the incident x-rays 102 may not be fully captured by the front screen 10 (scintillating front screen) because the material may not have enough crystals to convert all of the incident x-rays. The uncaptured (and not converted) x-rays may pass through the front screen 10 and the photosensor array 105 and reach the scintillating glass substrate 124. Thus, the scintillating glass substrate 124 facilitates the photosensor array 105 to capture extra photons from the x-rays that would not or could not be converted by the front screen 10.

The surface C of the scintillating glass substrate 124 is smooth. The surface C has a smoothness that meets a standard required for a substrate for electronic components. For example, the smoothness may be about 1 nm RMS. In other aspects of the disclosure, the smoothness may be about 1-about 5 nm RMS. In yet other aspects of the disclosure, the smoothness may be about 5 nm-about 20 nm RMS. In the description, the term "about" indicates that the value listed may be somewhat altered, as long as the alteration does not result in nonconformance of the process or structure to the illustrated disclosure. For example, for some elements the term "about" can refer to a variation of ±0.1%, for other elements, the term "about" can refer to a variation of ±1%, ±10% or ±20%, or any point therein.

In addition, the scintillating glass has a glass transition temperature above 300 degrees C., and preferably above 600 degrees C., in order to provide dimensional stability under TFT array thermal processing conditions.

The front screen 10 may comprise a scintillating phosphor layer or material. For example, the front screen 10 may include phosphor crystals that may capture the incident x-rays 102 and convert the captured x-rays into light photons 103. In some examples, the screen 10 may be a powder or granular type (e.g., GdO2S2:Tb, CaWO4, BaFCl:Eu). In other examples, the screen 10 may be comprised of nanometer-sized particles such as quantum dots, rather than the micron sized particles typical of "standard" screens such as GdO2S2:Tb. In still other examples, the scintillating material may be of the perovskite type. The front screen may emit light photons (e.g., photon bursts) in the visual light region.

In other aspects of the disclosure, the front screen 10 may comprise a structured scintillating layer. For example, the front screen 10 may include scintillating phosphor needle structures that may capture the incident x-rays 102 and convert the captured x-rays into light photons 103. In some examples, the front screen 10 may be a vacuum deposited needle structure composed of CsI:Tl. Where CsI:Tl is used, the front screen 10 may emit light in about 550 nm region. In other aspects of the disclosure, a liquid scintillating material may be used. In some examples, a combination of different types of scintillating materials and types may be used.

The screens 10, 20 may have different thicknesses. As shown in FIG. 1, the back screen 20 is thicker than the front screen 10. This is to allow the thinner front screen to capture fine details in the incoming spatial pattern of x-rays, while the thicker back screen compensates for the fact that some of the incoming x-ray flux is then not captured by the front screen. The thicker the front screen 10 is, less incident x-rays 102 arrive in the back screen 20. Thus, the thickness of each screen may be determined based on certain performance needs, which include signal-to-noise ratio and may be based on a particular application that the structure 1 is used for.

In other aspects of the disclosure, the front screen 10 may be comprised of a scintillating glass.

In another aspect of the disclosure, the front screen 10 may include a backing layer 15 (also referred to herein as "backing"). The backing 15 is attached or in contact with the surface A. The backing 15 may serve multiple purposes. For example, the backing 15 may provide support for the scintillation portion of the front screen 10. Additionally, the backing layer 15 may have optical characteristic(s) for the wavelength of the light photons created in the front screen 10. For example, the backing 15 may be absorptive for the light photons or reflective of the light photons. The optical characteristic of the backing may be determined based on the application for the structure 1 and desired performance requirements. For example, in an aspect of the disclosure, the diffuse optical reflectance of the backing 15 may be very high (above about 90%) to maximize imaging signal-to-noise ratio, or low (below about 10%) if the objective is to maximize imaging spatial resolution.

In an aspect of the disclosure, the material used for the backing 15 may also depend on the type of scintillating material used for the front screen 10. For example, an amorphous carbon or aluminum layer or a fiber optic may be used as the backing for a CsI:Tl screen. Other types of materials may be used for screens made from powders or granular. For example, the backing layer 15 may be made of a polymeric material such as polyester or PET (polyethylene terephthalate) for a powder screen.

The front screen 10 may also include a protective layer (not shown), if needed. This may depend on the type of screen. The protective layer may be in addition to the backing 15. In other aspects of the disclosure, the backing 15 serves also as the protective layer.

As shown in FIG. 1, there is no backing for the back screen 20. This is because the back screen 20 is comprised of a scintillating glass substrate and may not need support. However, depending on the application for the device, a backing having optical characteristics may be used, e.g., absorptive or reflective to the light photons in the back screen. Where a backing is used, the backing would be in contact with or attached to the surface D. In an aspect of the disclosure, the backing may be reflective or absorptive paint.

The photosensor array 105 may include a plurality of photosensitive storage elements 108 and switching elements 106.

The photosensor array 105 may be produced by direct deposition onto the top surface of the scintillating glass substrate 124, using known TFT array manufacturing methods like plasma enhanced chemical vapor deposition (PECVD).

The photosensitive storage elements 108 produce an electrical signal (charge) in response to light photons from both the front screen 10 and the back screen 20. Given the scattering and possible absorption of the light photons traveling in different directions, not all of the converted light photons by the front screen 10 and the back screen 20 may reach the photosensitive storage elements 108. The electrical signal is proportional to the sum of all the light photons (that reach the photosensitive storage elements from the front screen 10 and back screen 20 and are absorbed in the photosensitive elements). The photosensitive storage elements 108 may be a-Si:H photodiodes, MIS-type sensors, or other sensor types known in the art. The switching elements 106 may be thin film transistor (TFT) elements of the a-Si:H type, metal oxide (MOTFT) types, or other types known in the art. Each switching element 106 corresponds to a photosensitive storage element 108. Each switching element 106 is used to readout the electrical signal from the corresponding storage element 108.

The photosensor array 105 may also include additional layers (not shown in FIG. 1), such as, but not limited to, a biasing metal layer and a metal layer on the opposite side and other layers of e.g., a photodiode (and other dielectric materials or layer). The biasing metal layer and a metal layer on the opposite side are shown in examples of the structure 100/200 shown in FIGS. 3 and 4.

An example of a photosensor array 105 (which is shown in FIG. 2 without the various layers, however, for descriptive purposes, the same label is used) and peripheral electronics are shown in FIG. 2. The example in FIG. 2 shows a 3×3 array. Thus, in the example, there are nine pixels 5. However, the number of pixels in FIG. 2 are shown just as an example, for descriptive purposes only, and any number of columns and rows of pixels may be used. The number of pixels may be based on a specific application of use for the structure 1. As shown in FIG. 1, a pixel includes the photosensitive storage element 108 and switching element 106. In the example, the switching element 106 is shown in the corner of the pixel 5. In other aspects of the disclosure, the switching element 106 may be in other places.

FIG. 2 also shows certain components of an imaging system that are for scanning the structure and subsequently producing the image (referenced above as peripheral electronics). The image has a plurality of pixels 5. As shown, a scanning control unit 205 is coupled to each row of pixels via a gate line 222. A bias voltage is applied to the photosensitive storage elements 108. The transparent metal bias layer 107 (shown in FIGS. 3 and 4) is an example of a component used for the bias voltage. The switching elements 106 are controlled via their respective gate line 222. When a switching element 106 is turned on, it passes a charge to a respective data line 226. Each data line is connected to a plurality of charge amplifiers 208.

The plurality of charge amplifiers 208 are coupled to a multiplexer 210. The multiplexer 210 in turn is coupled to an A/D 215 (converter) which supplies an input to the processor 200. The processor 200 controls the scanning control unit 205 to turn on/off the switching element 106. The processor 200 may store the electrical signals from the storage elements/switches in the memory (not shown in FIG. 2). An image may be produced using the digital values stored in memory. The charge amplifiers 208 are typically implemented in custom ASIC chips. The scanning control unit 205 is typically implemented with gate control chips available from the display industry. The multiplexer 210 is used to reduce the number of connections from the amplifiers, and to reduce the number of ADC channels. To handle the large amount of data sampled from the photosensor array quickly, the memory is typically included in processor 200. In an aspect of the disclosure, a host computer 250 (e.g., another processor) is coupled to the processor 200 via an interface. The host computer 250 receives digital pixel information from the memory buffer and can produce a visual representation of the image on a display (not shown).

The scanning control unit 205 turns on/off the switching elements 108 sequentially one row at a time. Other elements of the imaging system are well known to those in the art.

The processor 200 is typically physically integrated with the flat panel detector and may be electronically integrated with gate control chips, amplifier chips, a buffer memory, and an interface to a host computer 250. The chips are typically implemented as application specific integrated circuits (ASICs) which in turn may each handle hundreds of data channels.

The host computer 250 may be a microcontroller or microprocessor or any other processing hardware such as a CPU or GPU. The memory (not shown) may be separate from the processor (as or integrated in the same). For example, the microcontroller or microprocessor includes at least one data storage device, such as, but not limited to, RAM, ROM and persistent storage. In an aspect of the disclosure, the processor may be configured to execute one or more programs stored in a computer readable storage device.

Figure 3:
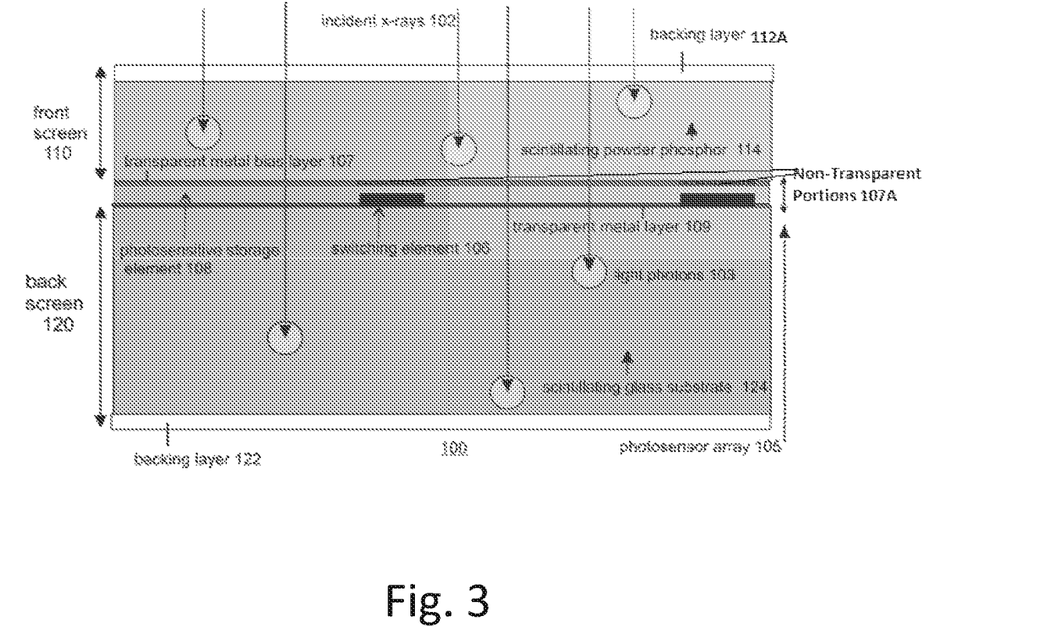
FIG. 3 is a schematic cross-sectional view of a structure having a scintillating powder phosphor for the front screen in accordance with aspects of the disclosure.

FIG. 3 shows an example of a structure 100 in accordance with aspects of the disclosure. Where the components in structure 100 are the same as previously described (for structure 1), a full description of the same will not be repeated. In the example depicted in FIG. 3, the structure 100 has a front screen 110 having a scintillating powder phosphor 114. The front screen 110 also has a backing layer 112A. Since a scintillating powder phosphor 114 is used in the example depicted in FIG. 3, the backing layer 112A may comprise a polymer material. The backing layer 112A may be absorptive or reflective to the light photons (at the emitted wavelength by the scintillating powder phosphor 114). For example, the diffuse optical reflectance of the backing layer may be very high (above about 90%) to maximize imaging signal-to-noise ratio, or low (below about 10%) if the objective is to maximize imaging spatial resolution.

Between the front screen 110 and back screen 120 is the photosensor array 105. This photosensor array 105 is similar to the photosensor array shown in FIG. 1; however, in FIG. 3 a transparent metal bias layer 107 and a transparent metal layer 109 are shown. These layers were omitted from the drawing in FIG. 1 for simplifying the figure, however, these layers would also be in structure 1.

The transparent metal bias layer 107 is transparent at the wavelength(s) emitted by the scintillating powder phosphor 114, and may be used to apply a reverse bias voltage to the array of photosensitive elements 108. In aspects of the disclosure, the transparent metal bias layer 107 comprises an indium tin oxide (ITO) layer. In other aspects of the disclosure, other transparent metals may be used such as zinc oxide (ZO), fluoride doped tin oxide (FTO), or poly (3,4-ethylenedioxythiophene) (PEDOT).

The transparent metal layer 109 is transparent at the wavelengths emitted by the scintillating glass substrate 124. In an aspect of the disclosure, the transparent metal bias layer 107 and the transparent metal layer 109 may be made of the same material such as ITO. In other aspects of the disclosure, a different metal may be used for the transparent metal layer 109 and the transparent metal bias layer 107.

In an aspect of the disclosure, the transparent metal bias layer 107 may have non-transparent portions 107A. The non-transparent portions 107A are not transparent at the wavelengths emitted by the scintillating powder phosphor 114. The non-transparent portions 107A are aligned with the switching elements 106. The non-transparent portions 107A absorb the light photons from the front screen 110 in order to prevent photoconductive action in the a-Si:H material of the switching elements 106. The non-transparent portions 107A are shown in FIG. 3 with a hashing. In an aspect of the disclosure, the non-transparent portions 107A may be colored. For example, a paint may be coated on the transparent metal bias layer 107 where the switching elements 106 are located, or a non-transparent layer may be deposited by photolithography. In this case, a photosensitive material (resist) may be first be coated over the entire surface to be patterned. The photoresist may then be exposed by UV light through a mask, developed, and removed in the areas to be made opaque. A thin film of opaque metal like Al or Cr may then be evaporated onto the patterned areas, and the remaining resist stripped or removed.

In another aspect of the disclosure, the transparent metal layer 109 may also have non-transparent portions, which are not transparent at the wavelength(s) emitted by the scintillating glass substrate 124. The non-transparent portions (of the metal layer 109) may be made in a similar manner as described above.

The scintillating glass substrate 124 in structure 100 may be one of the scintillating glasses described above. The thickness of the scintillating glass substrate 124 may be selected in the range of about 200 to about 2000 microns. The thickness of the scintillating glass substrate 124 may be chosen based on a particular application(s) and consider a signal-to-noise performance for the particular application. In an aspect of the disclosure, a thickness of the scintillating powder phosphor 114 may be less than a thickness of the scintillating glass substrate 124. The relative thickness of the two may be chosen based on particular application(s).

In FIG. 3, the scintillating glass substrate 124 has a backing layer 122. However, as described above, this backing layer 122 is optional and may increase structural stability. The backing layer 122 may be absorptive or reflective to the light photons emitted at the wavelength(s) from the scintillating glass substrate 124.

The front screen 110 and the back screen 120 may be oriented such that the scintillating powder phosphor 114 and the scintillating glass substrate 124 face each other. In the orientation of the structure 100 shown in FIG. 3, the backing 112A of the front screen 110 may be a top surface of the structure 100 and a backing layer 122 of the second screen 120 may be a bottom surface of the structure 100.

Figure 4:
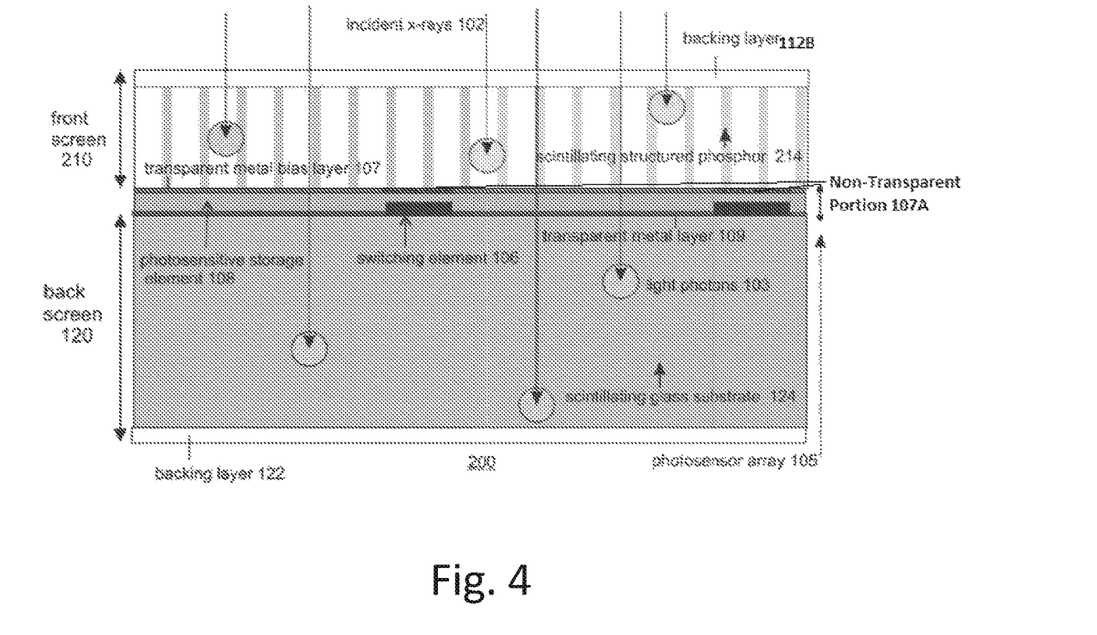
FIG. 4 is a schematic cross-sectional view of a structure having a scintillating structured phosphor for the front screen in accordance with aspects of the disclosure.

FIG. 4 shows an example of a structure 200 in accordance with aspects of the disclosure. Where the components are the same as previously described (for structures 1 and 100), a full description of the same will not be repeated. In the example depicted in FIG. 4, the structure 200 has a front screen 210 having a scintillating structured phosphor 214. An advantage of a scintillating structured phosphor is that the structure provides channels for the converted light photons to travel to the photosensitive storage elements 108. These channels facilitate the dispersing the light photons over the photosensor array 105. The scintillating structured phosphor 214 may include scintillating phosphor needle structures that may capture the incident x-rays 102 and convert the captured x-rays into light photons 103. For example, the screen 210 may be a vacuum deposited needle structure composed of CsI:Tl. The needles are schematically depicted in FIG. 4 as shaded lines. The front screen 210 also has a backing layer 112B. The backing layer 112B may be an amorphous carbon or aluminum layer. As with the backing layer 112A, the backing layer 112B may also be absorptive or reflective to the light photons (at the emitted wavelength by the scintillating structure phosphor 214).

In FIG. 4, the scintillating glass substrate 124 has a backing layer 122. However, as described above, this backing layer 122 is optional and may increase structural stability. The backing layer 122 may be absorptive or reflective to the light photons emitted at the wavelength(s) from the scintillating glass substrate 124.

FIGS. 1, 3 and 4 depict the scintillating glass substrate as the back screen. However, the structures may be inverted and the scintillating glass substrate is the front screen.

Testing and Experimentation

A series of theoretical calculations of detective quantum efficiency vs spatial frequency DQE(f) have been done to show the benefit of the structures described herein. DQE describes the signal-to-noise performance of the detector, and is the accepted standard for comparing systems for medical radiography. Here the scintillating phosphor layer (front screen) was taken to have the known imaging properties of a gadolinium oxysulfide (GOS) screen, and the incoming x-rays were taken to have an RQA9 spectrum, representative of x-ray beams used in medical applications like cone beam computed radiography. The photosensitive light detection layer was taken as sensitive to a front screen and a back screen, e.g., bi-directionally. The results are shown in the graph 500 (see, FIG. 5) which shows four curves 501, 502, 503 and 504 (DQE verses spatial frequency). The calculations were done for the case of no scintillating glass substrate (curve 501) which has a structure similar to the structure depicted in FIG. 7, and also for scintillating glass substrates of three different thicknesses (curve 502 for 100 μm scintillating glass, curve 503 for 300 μm scintillating glass and curve 504 for 1000 μm scintillating glass).

Figure 5:
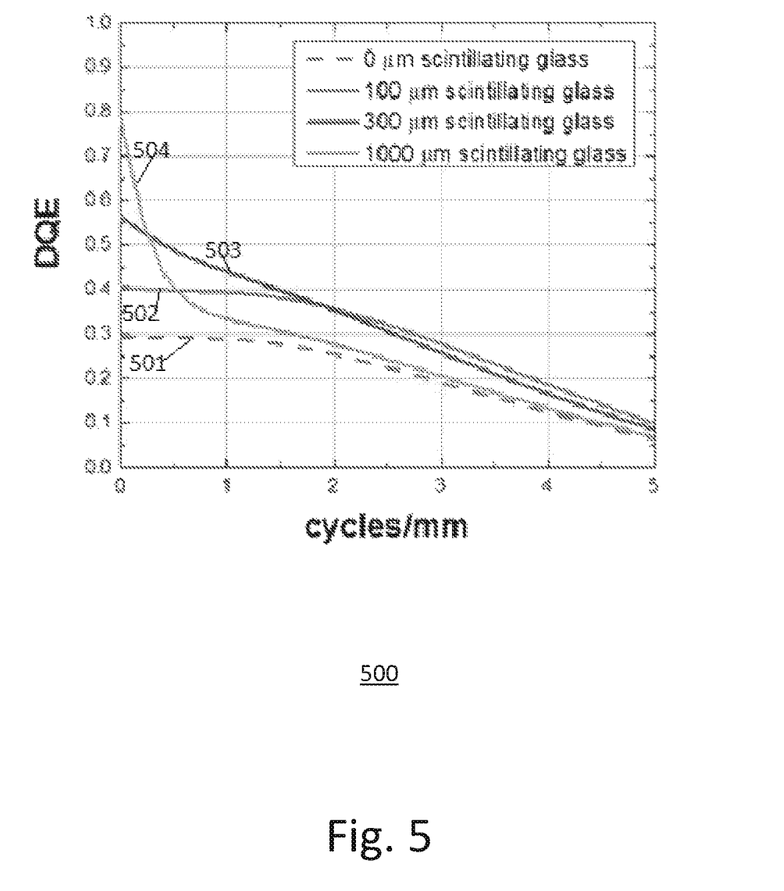
FIG. 5 shows theoretical calculations illustrating the DQE (signal-to-noise) advantage of a structure as described herein.

As can be seen from curves 502-504, the DQE is improved at all spatial frequencies using the scintillating glass substrate. Further, as seen from curve 502, a thin scintillating glass layer (e.g. 300 microns) improves DQE(f) at both low and high frequencies, meaning improved detection of both large and small objects (large being at low frequencies).

A thicker scintillating glass layer (e.g., 1000 microns) shown in curve 504 improves DQE(f) greatly at low frequencies while not changing performance at high frequencies, meaning much improved detection of large objects (masses) with unchanged detection of small objects.

This suggests that the thickness of the scintillating glass may be set or selected based on the application including the type of object(s) being detected (and size thereof).

Figure 6:
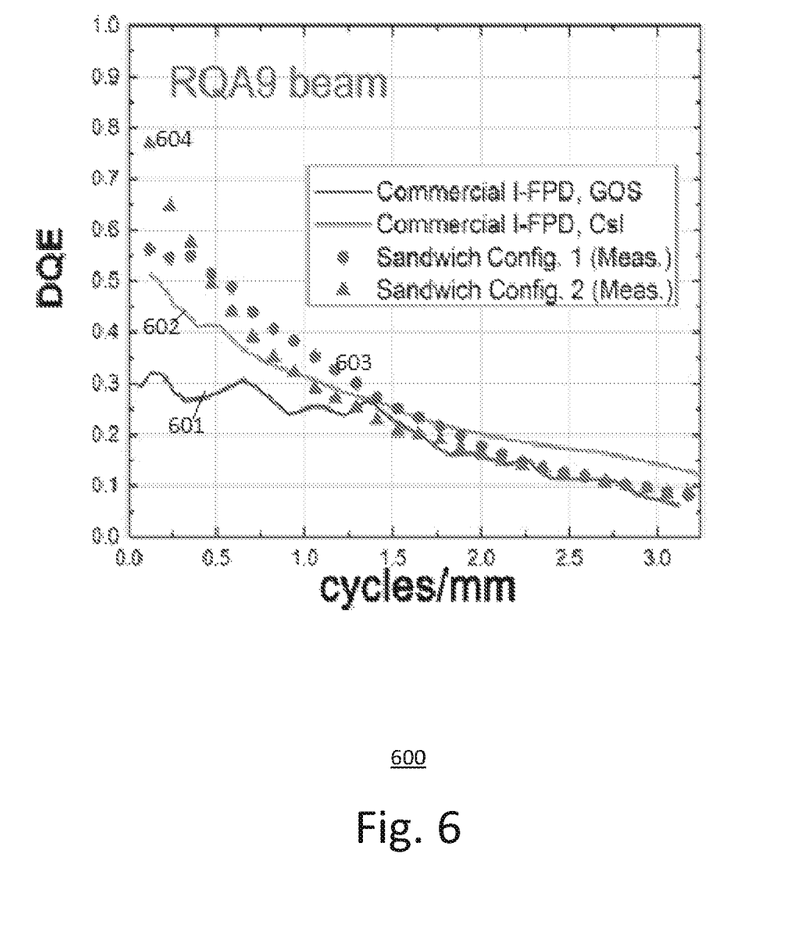
FIG. 6 shows experimental data illustrating the DQE (signal-to-noise) advantage of a structure having two screens.

FIG. 6 shows experimental results on a graph 600 which shows the advantages of a dual-screen structure. The experiment compared commercial single screen structures (two different devices) and different sandwich configurations. One of the commercial single screen structures was a gadolinium oxysulfide (GOS) screen. The results for this screen are shown in curve 601. The other of the commercial single screen structures was a CsI screen (needle type). The results for this screen are shown in curve 602. For the sandwich configurations (dual screen), both the front and the back screens were taken as GOS screens. A self-scanning 2D array of TFT switches and light sensing photodiodes were optically coupled to various x-ray screens by direct pressure. The various screens were exposed to x-rays in both directions (FI, BI) and with varying x-ray beam qualities and the TFT test array was used to measure sensitivity, spatial response, and noise performance for each. In "front screen" mode the measurements were made in the conventional FI setup, and in "back screen" mode, particular front screens were used to filter the x-ray beam before exposure of the back screen, as they would be used in a dual-screen FPD configuration. By weighted combination of the measured results in "front screen" and "back screen" modes, measured estimates of the actual performance of the dual-screen imager configurations were obtained. For curve 603, the front and back screen had the same thickness. For curve 604, the back screen was thicker than the front screen. As seen by comparing curves 601 and 602 with 603 and 604, there is a very large DQE improvement for the dual-screen configuration at low spatial frequencies verses the single screen configuration. The commercial CSI screen is better than the commercial GOS screen. It can also be seen from curves 603 and 604, that having the back screen thicker than the front screen, the DQE is improved at low spatial frequencies.

Improvements will be higher at higher energies of the x-ray source including cone-beam CR.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A structure comprising:
a first scintillating screen that converts an absorbed portion of incident x-ray for medical radiography directed at the structure into light photons;
a photosensor array;
a second scintillating screen comprised of a scintillating glass, the photosensor array being between the first scintillating screen and the second scintillating screen, the scintillating glass converts an absorbed portion of the incident x-ray for medical radiography transmitted through the first scintillating screen and the photosensor array into light photons, where a surface of the first scintillating screen faces the photosensor array and a surface of the scintillating glass faces the photosensor array, wherein the surface of the scintillating glass is a substrate for the photosensor array without another substrate being between the scintillating glass and a 2D patterned metal layer, wherein the second scintillating screen further comprises a backing, the backing contacting another surface of the scintillating glass, the another surface being opposite of the surface facing the photosensor array, and the backing is absorptive to the light photons, wherein the photosensor array is operable to capture at least a portion of the light photons from the first scintillating screen and the second scintillating screen and convert the captured light photons into electrical signals, wherein the photosensor array comprises:
a plurality of photosensitive storage elements for capturing the at least a portion of the light photons from the first scintillating screen and the second scintillating screen;
a plurality of switching elements, where one switching element of the plurality of switching elements corresponds to one of the plurality of photosensitive storage elements, respectively; and
a metal bias layer comprising transparent portions and non-transparent portions, and
the 2D patterned metal layer comprising at least transparent portions, where each non-transparent portion of the metal bias layer aligns with a corresponding switching element as viewed from the metal bias layer to the 2D patterned metal layer and the non-transparent portions of the metal bias layer are configured to block light photons generated in the first scintillating screen from interacting with the corresponding switching element.

2. The structure of claim 1, wherein the scintillating glass and the photosensor array are in direct optical contact with each other.

3. The structure of claim 1, wherein the 2D patterned metal layer and the metal bias layer are comprised of indium tin oxide (ITO).

4. The structure of claim 1, wherein the scintillating glass has a thickness about 200 microns to about 2000 microns, where the thickness is based on an application of the structure.

5. The structure of claim 1, wherein the first scintillating screen comprises a scintillating phosphor layer.

6. The structure of claim 5, wherein the scintillating phosphor layer is a powder or granular type, or a nanocrystalline powder type or perovskite scintillator type and the first scintillating screen further comprises a backing, the backing contacting the scintillating phosphor layer.

7. The structure of claim 6, wherein the backing of the first scintillating screen is reflective or absorptive to the light photons based on an application of the structure.

8. The structure of claim 5, wherein the scintillating phosphor layer is a structured or needle type.

9. The structure of claim 1, wherein a thickness of the second scintillating screen is greater than a thickness of the first scintillating screen.

10. The structure of claim 1, wherein the scintillating glass comprises luminescent nanocrystals in a glass matrix.

11. The structure of claim 1, wherein the scintillating glass comprises rare-earth halides.

12. The structure of claim 1, wherein the surface of the scintillating glass has a smoothness of less than about 20 nm RMS.

13. The structure of claim 1, wherein the scintillating glass has a glass transition temperature above 300° C.

14. The structure of claim 1, wherein the scintillating glass has a glass transition temperature above 600° C.

15. An imaging system comprising:
a processor configured to be in communication with a structure comprising:
a first scintillating screen that converts an absorbed portion of incident radiation directed at the structure into light photons;
a photosensor array configured to produce an image having a plurality of pixels, each photosensor in the array comprises a photosensitive storage element and a switching element and represents a pixel in the image of the plurality of pixels, the photosensor array further comprising a metal bias layer comprising transparent portions and non-transparent portions and a 2D patterned metal layer comprising at least transparent portions, where each non-transparent portion of the metal bias layer aligns with a corresponding switching element as viewed from the metal bias layer to the 2D patterned metal layer and the non-transparent portions of the metal bias layer are configured to block light photons generated in the first scintillating screen from interacting with the corresponding switching element; and
a second scintillating screen comprised of a scintillating glass, the photosensor array being between the first scintillating screen and the second scintillating screen, the scintillating glass converts an absorbed portion of the incident radiation transmitted through the first scintillating screen and the photosensor array into light photons, where a surface of the first scintillating screen faces the photosensor array and a surface of the scintillating glass faces the photosensor array, wherein the surface of the scintillating glass is a substrate for the photosensor array without another substrate being between the scintillating glass and the 2D patterned metal layer;
wherein the photosensor array is operable to capture at least a portion of the light photons from the first scintillating screen and the second scintillating screen and convert the captured light photons into electrical signals,
the processor is configured to:
receive the electrical signals from the structure; and
produce the image having the plurality of pixels using the electrical signals.

* * * * *